(12) United States Patent
Lo

(10) Patent No.: US 7,417,862 B2
(45) Date of Patent: Aug. 26, 2008

(54) HEAT SINK FIXING DEVICE

(75) Inventor: Wen-Chuan Lo, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 302 days.

(21) Appl. No.: 11/178,635

(22) Filed: Jul. 11, 2005

(65) Prior Publication Data
US 2006/0077639 A1    Apr. 13, 2006

(30) Foreign Application Priority Data
Oct. 12, 2004  (TW) ............................... 93130883 A

(51) Int. Cl.
*H05K 7/20* (2006.01)

(52) U.S. Cl. ................ 361/719; 361/704; 361/717; 165/80.3; 174/16.3

(58) Field of Classification Search ............... 361/717, 361/719, 704; 165/80.3, 165; 257/E23.103, 257/722, 718; 174/16.3
See application file for complete search history.

(56) References Cited

U.S. PATENT DOCUMENTS

| | | | | |
|---|---|---|---|---|
| 3,047,648 A | * | 7/1962 | Mowatt | 174/16.1 |
| 4,054,901 A | * | 10/1977 | Edwards et al. | 257/718 |
| 4,344,106 A | * | 8/1982 | West et al. | 361/717 |
| 4,387,413 A | * | 6/1983 | Griffis | 361/717 |
| 4,388,967 A | * | 6/1983 | Breese | 165/80.3 |
| 4,588,028 A | * | 5/1986 | Marshall et al. | 165/185 |
| 4,602,315 A | * | 7/1986 | Breese | 361/709 |
| 4,605,058 A | * | 8/1986 | Wilens | 165/80.2 |
| 4,625,260 A | * | 11/1986 | Jordan et al. | 361/720 |
| 4,691,765 A | * | 9/1987 | Wozniczka | 165/80.3 |
| 4,872,505 A | * | 10/1989 | Jones et al. | 165/80.3 |
| 4,890,196 A | * | 12/1989 | Hinshaw | 361/709 |
| D313,399 S | * | 1/1991 | Earl et al. | D13/179 |
| 5,305,179 A | * | 4/1994 | Sono et al. | 361/718 |
| 5,586,005 A | * | 12/1996 | Cipolla et al. | 361/719 |
| 5,775,418 A | * | 7/1998 | Lonergan et al. | 165/80.2 |
| 5,901,781 A | * | 5/1999 | Arai et al. | 165/80.3 |
| 5,917,701 A | * | 6/1999 | Solberg | 361/704 |
| 6,068,051 A | * | 5/2000 | Wendt | 165/185 |
| 6,076,594 A | * | 6/2000 | Kuo | 165/80.3 |
| 6,180,874 B1 | * | 1/2001 | Brezina et al. | 174/16.3 |
| 6,195,257 B1 | * | 2/2001 | Janicek et al. | 361/704 |
| 6,252,773 B1 | * | 6/2001 | Werner | 361/704 |
| 6,269,906 B1 | * | 8/2001 | Dockter et al. | 182/92 |
| 6,289,975 B2 | * | 9/2001 | Kuo | 165/80.3 |
| 6,351,385 B1 | * | 2/2002 | Featherstone, III | 361/704 |
| 6,587,344 B1 | * | 7/2003 | Ross | 361/704 |
| D479,830 S | * | 9/2003 | Lee | D13/179 |
| 6,735,084 B1 | * | 5/2004 | Choi et al. | 361/704 |
| 6,777,105 B2 | * | 8/2004 | Kadokawa | 428/595 |

(Continued)

*Primary Examiner*—Boris L. Chervinsky
*Assistant Examiner*—Courtney L Smith

(57) ABSTRACT

A heat sink fixing device for fixing a heat sink on a printed circuit board is disclosed. The fixing device comprises a connecting portion fixed on one side of the heat sink, an extension portion connected with the connecting portion, a first pin extended downward from partial lower edge of the extension portion for plugging into the printed circuit board, and a second pin extended downward from partial lower edge of the connecting portion and connected with the first pin for plugging into the printed circuit board. The heat sink fixing device can strengthen the pin structure, increase the tin soldering area and fix the heat sink on the printed circuit board firmly.

20 Claims, 7 Drawing Sheets

U.S. PATENT DOCUMENTS

| | | | |
|---|---|---|---|
| 6,782,941 B2 * | 8/2004 | Lee | 165/80.3 |
| 6,822,867 B2 * | 11/2004 | Hsieh | 361/704 |
| 6,864,433 B1 * | 3/2005 | Fetzer et al. | 174/138 G |
| D540,750 S * | 4/2007 | Lee | D13/179 |
| 2002/0145854 A1 * | 10/2002 | Lin | 361/719 |
| 2004/0042177 A1 * | 3/2004 | Geva et al. | 361/705 |

* cited by examiner

HEAT SINK FIXING DEVICE

FIELD OF THE INVENTION

The present invention relates to a fixing device, and more particularly to a fixing device for fixing a heat sink on a printed circuit board.

BACKGROUND OF THE INVENTION

The heat sink is a requisite component used to deal with the heat-dissipating problem in various electronic devices for a long time. Take the power supply of a liquid crystal display or notebook as an example; the electronic components disposed on the printed circuit board (PCB) include the capacitor, resistor, inductor, transformer, diode, metal oxide semiconductor field effect transistor (MOSFET), die, and so on. When the power supply is operated, these electronic components will produce heat at different levels. If the heat cannot be dissipated efficiently, the electronic components will be out of order due to the overheated condition, and even more, the whole system might shut down. Therefore, the heat sink is an important component to the power supply for solving the heat-dissipating problem thereof.

For dissipating heat in an efficient way, the heat sink is usually attached on the high power component such as the chip. Due to the limitation of the circuit layout and the space arrangement, the high power transistor can be secured on the heat sink that is fixed on the printed circuit board, so that a heat-dissipating area can be provided in the direction perpendicular to the printed circuit board for dissipating the heat of the transistor. Please refer to FIG. 1, which is a schematic diagram showing a conventional structure for fixing the heat sink on the printed circuit board. As shown in FIG. 1, the fixing device 2 is disposed at the bottom of the heat sink 1 for fixing the heat sink 1 on the printed circuit board 3. The fixing device 2 of the heat sink 1 comprises a connecting portion 21 and a pin 22, wherein the connecting portion 21 is riveted on one side at the bottom of the heat sink 1 and the pin 22 is extended downward from the lower edge of the connecting portion 21. When the heat sink 1 is to be fixed on the printed circuit board 3, the pin 22 of the fixing device 2 is plugged into the corresponding pinhole 31 on the printed circuit board 3. Then, the heat sink 1 is secured on the printed circuit board 3 after the tin soldering process.

The fixing device 2 of the heat sink 1 is often made of a thin metal plate in order to increase usable space for the printed circuit board 3. However, since the heat sink 1 has a certain weight, in the processes of assembling, delivering or using, the fixing device 2 may become deformed and thus fails to carry the heat sink 1 efficiently if the mechanical strength of the pin 22 is not strong enough or the soldering area of the pin 22 is too small to secure the heat sink 1 on the printed circuit board 3 well. Further, the shaking force may be passed to the transistor (not shown) secured on the heat sink 1 through the fixing device 2, resulting in the break of the pins of the transistor which are plugged onto the printed circuit board 3. Moreover, the aforesaid force may also be passed to the printed circuit board 3 through the pins of the transistor, resulting in the damage of the copper foil on the printed circuit board 3 or the break of the solder ball between the pin 22 of the fixing device 2 and the printed circuit board 3. The above conditions may cause the collapse of the heat sink 1, and further result in a bad connection or even short circuit of the printed circuit board 3.

Therefore, it is required to develop a fixing device that can fix the heat sink on the printed circuit board firmly.

SUMMARY OF THE INVENTION

An object of the present invention is to provide a heat sink fixing device for fixing a heat sink on a printed circuit board, which strengthens the pin structure and enhances the bearable bending stress of the pin structure of the fixing device, so as to avoid short circuit of the printed circuit board caused by the collapse of the heat sink.

Another object of the present invention is to provide a heat sink device for intensifying the heat sink-carrying capacity of the pin structure of the fixing device to reduce the loading of the pins of the transistor on the heat sink, and further prevent the pins of the transistor and the copper foil on the printed circuit board from break or damage.

An additional object of the present invention is to provide a heat sink fixing device with a larger tin soldering area to avoid the break or damage of the solder ball after the tin soldering process and better secure the heat sink on the printed circuit board.

According to an aspect of the present invention, there is provided a heat sink fixing device for fixing a heat sink on a printed circuit board. The fixing device comprises a connecting portion fixed on one side of the heat sink, an extension portion connected with the connecting portion, a first pin extended downward from partial lower edge of the extension portion for plugging into the printed circuit board, and a second pin extended downward from partial lower edge of the connecting portion and connected with the first pin for plugging into the printed circuit board.

In an embodiment, the widths of the first pin and the second pin are smaller than those of lower edges of the extension portion and the connecting portion, respectively.

In an embodiment, the connecting portion, the extension portion, the first pin, and the second pin are integrally formed.

In an embodiment, an included angle between the extension portion and the connecting portion is substantially 90°, thereby the first pin and the second pin are connected together to form an L-shaped pin structure.

In an embodiment, the heat sink fixing device is made of a metal plate, and the heat sink is made of aluminum or copper.

In an embodiment, the heat sink fixing device further comprising a plurality of extension ribs extended perpendicularly to the first pin and the second pin from partial lower edges of the extension portion and the connecting portion respectively for assisting in positioning said heat sink.

According to another aspect of the present invention, there is provided a heat sink fixing device for fixing a heat sink on a printed circuit board. The fixing device comprises a connecting portion fixed on one side of the heat sink, an extension portion connected with the connecting portion, and a first pin extended downward from partial lower edge of the extension portion and connected with the connecting portion for plugging into the printed circuit board with a lower part of the connecting portion.

In an embodiment, a width of the first pin is smaller than that of a lower edge of the extension portion.

In an embodiment, the connecting portion, the extension portion, and the first pin are integrally formed.

In an embodiment, an included angle between the extension portion and the connecting portion is substantially 90°, thereby the first pin and the connecting portion are connected together to form an L-shaped pin structure.

In an embodiment, the heat sink fixing is made of a metal plate, and the heat sink is made of aluminum or copper.

In an embodiment, the heat sink fixing device further comprises an extension rib extended perpendicularly to the first pin from partial lower edge of the extension portion for assisting in positioning the heat sink.

According to an additional aspect of the present invention, there is provided a heat sink structure comprising a heat sink and a fixing device disposed on one side at a bottom of the heat sink for fixing the heat sink on a printed circuit board. The fixing device comprises a connecting portion fixed on the side of the heat sink, an extension portion connected with the connecting portion, a first pin extended downward from partial lower edge of the extension portion for plugging into the printed circuit board, and a second pin extended downward from partial lower edge of the connecting portion and connected with the first pin for plugging into the printed circuit board.

In an embodiment, the widths of the first pin and the second pin are smaller than those of lower edges of the extension portion and the connecting portion, respectively.

In an embodiment, wherein the fixing device of the heat sink structure further comprises a plurality of extension ribs extended perpendicularly to the first pin the said second pin from partial lower edges of the extension portion and the connecting portion respectively for assisting in positioning said heat sink.

According to a further aspect of the present invention, there is provided a heat sink structure comprising a heat sink and a fixing device disposed on one side at a bottom of the heat sink for fixing the heat sink on a printed circuit board. The fixing device comprises a connecting portion fixed on the side of the heat sink; an extension portion connected with the connecting portion, and a first pin extended downward from partial lower edge of the extension portion and connected with the connecting portion for plugging into the printed circuit board with a lower part of the connecting portion.

In an embodiment, the fixing device further comprises an extension rib extended perpendicularly to the first pin from partial lower edge of the extension portion for assisting in positioning the heat sink.

In an embodiment, the connecting portion, the extension portion, and the first pin are integrally formed.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
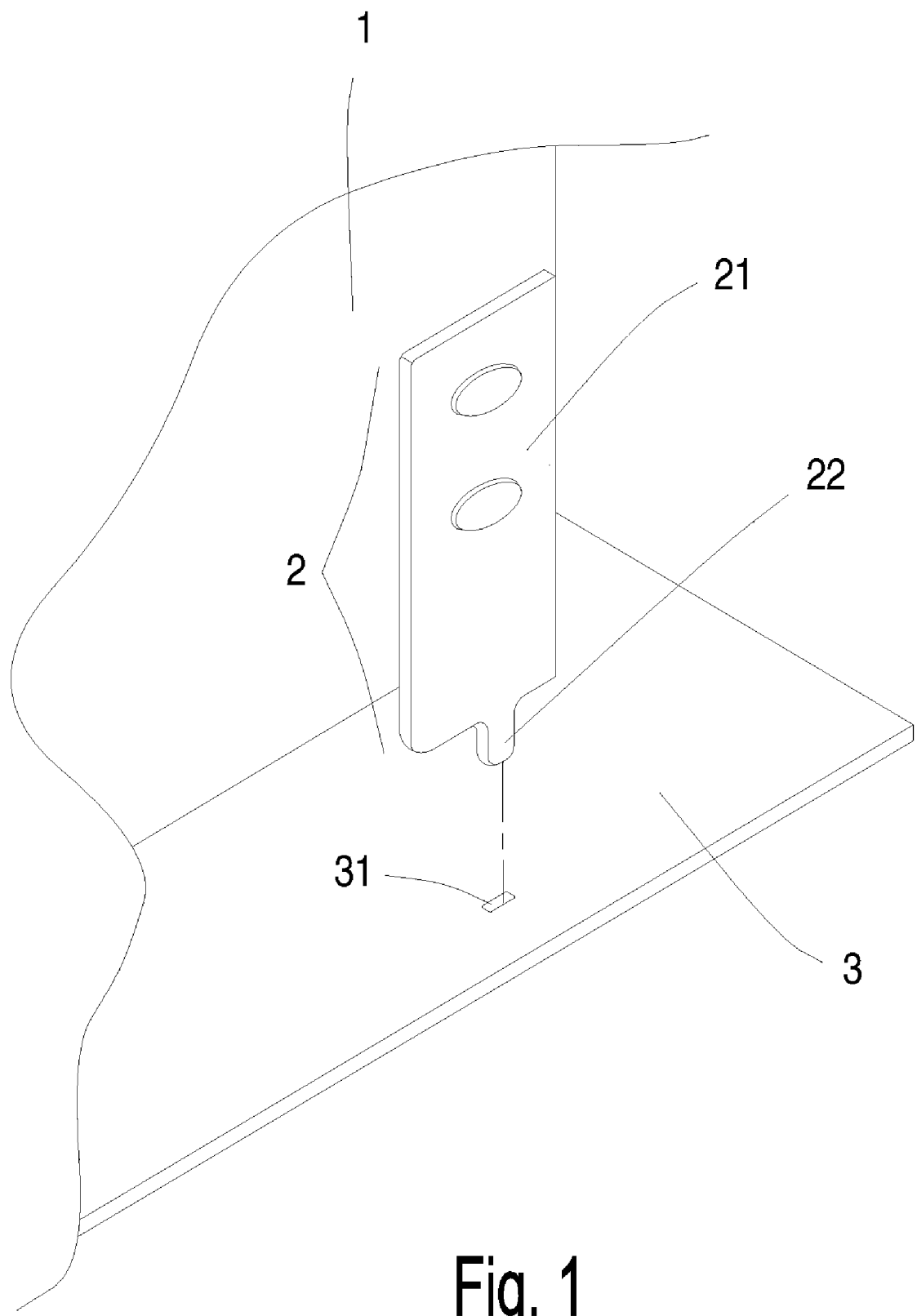
FIG. 1 is a schematic diagram showing a conventional structure for fixing the heat sink on the printed circuit board.
Figure 2:
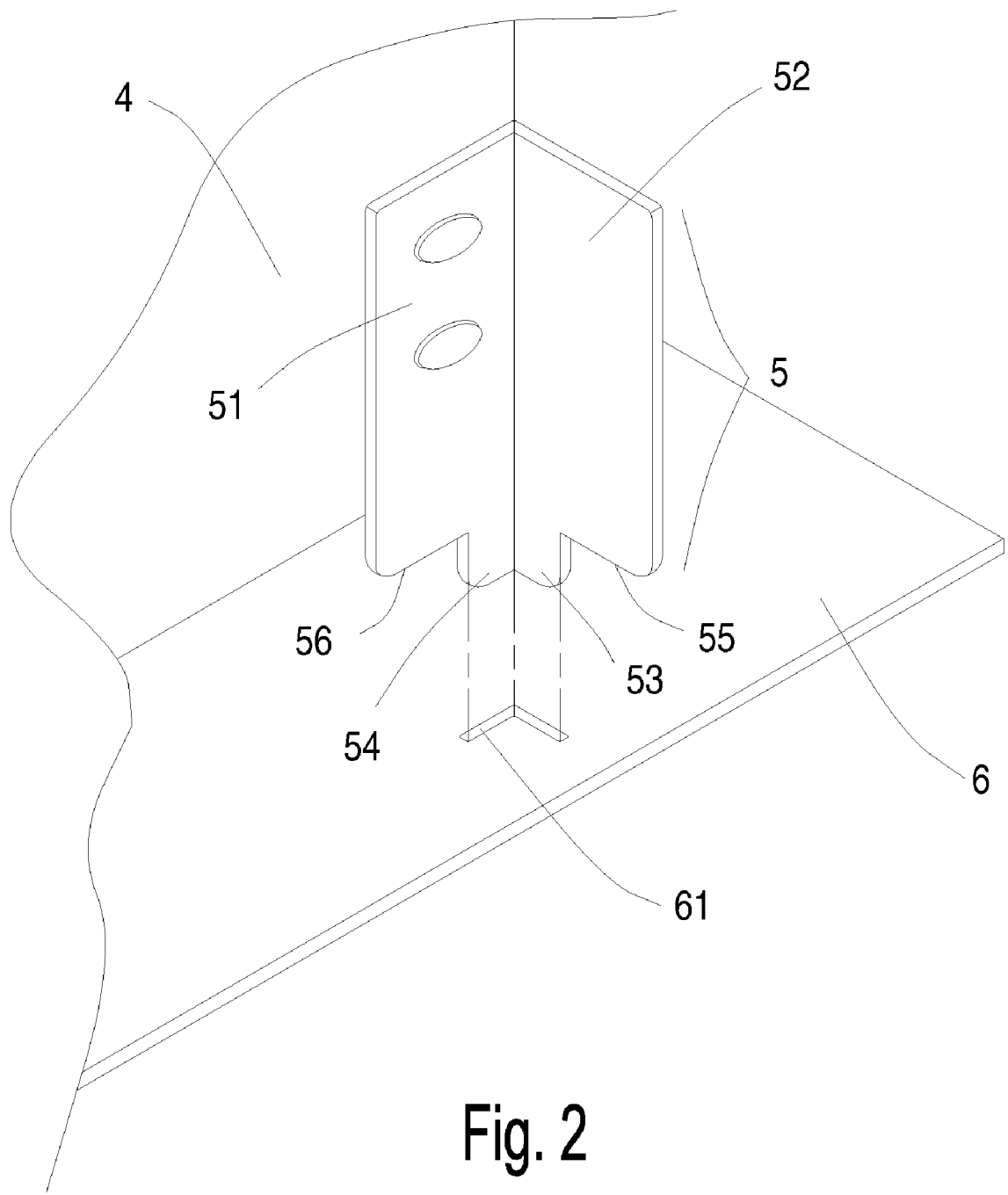
FIG. 2 is a schematic diagram showing the heat sink fixing device for fixing the heat sink on the printed circuit board according to a first preferred embodiment of the present invention.

Please refer to FIG. 2, which is a schematic diagram showing the heat sink fixing device for fixing the heat sink on the printed circuit board according to a first preferred embodiment of the present invention. As shown in FIG. 2, the fixing device 5 is disposed on one side at the bottom of the heat sink 4 for fixing the heat sink 4 on the printed circuit board 6. The heat sink 4 is preferably made of the metal with high thermal conductivity, such as aluminum or copper, and the shape of the heat sink 4 can be varied upon requirements to increase the heat-dissipating area. The high power transistor (not shown) can be secured on the heat sink 4, so that a heat-dissipating area can be provided in the direction perpendicular to the printed circuit board 6 for dissipating the heat of the transistor.

The fixing device 5 of the heat sink 4 is made of a metal plate and comprises a connecting portion 51, an extension portion 52, a first pin 53, and a second pin 54. The connecting portion 51 can be riveted to any side at the bottom of the heat sink 4 and connected with the extension portion 52. In this embodiment, an included angle between the extension portion 52 and the connecting portion 51 is substantially 90°, but not limited thereto. The first pin 53 is extended downward from the partial lower edge of the extension portion 52, and the second pin 54 is extended downward from the partial lower edge of the connecting portion 51 and connected with the first pin 53. In this embodiment, the included angle between the first pin 53 and the second pin 54 is substantially 90°, but not limited thereto, to form an L-shaped pin structure. Moreover, the widths of the first pin 53 and the second pin 54 are smaller than those of the lower edges of the extension portion 52 and the connecting portion 51, respectively. In some embodiments, the connecting portion 51, the extension portion 52, the first pin 53, and the second pin 54 are integrally formed.

Please refer to FIG. 2 again, when the heat sink 4 is to be fixed on the printed circuit board 6, the L-shaped pin structure formed by the first pin 53 and the second pin 54 is plugged into the corresponding pinhole 61 of the printed circuit board 6 for fixing the heat sink 4 on the printed circuit board 6. In the meantime, the lower edge 55 of the extension portion 52 and the lower edge 56 of the connecting portion 51 lean against the printed circuit board 6 for positioning the heat sink 4 on the printed circuit board 6. Then, the heat sink 4 is secured firmly on the printed circuit board 6 after the tin soldering process.

Due to the connection of the first pin 53 and the second pin 54 of the fixing device 5, the mechanical strength and the bearable bending stress of the pin structure are both enhanced for keeping the heat sink 4 from collapsing and affecting the circuits of the printed circuit board 6. Besides, the weight of the heat sink 4 is well carried by the first pin 53 and the second pin 54 to reduce the loading of the pins of the transistor on the heat sink 4, and therefore prevent the pins of the transistor and the copper foil on the printed circuit board from break or damage. Furthermore, since the L-shaped pin structure formed by the first pin 53 and the second pin 54 has a larger tin soldering area, the break or damage of the solder ball can be avoided. For these reasons, the heat sink 4 can be secured on the printed circuit board 6 more firmly.

Figure 3:
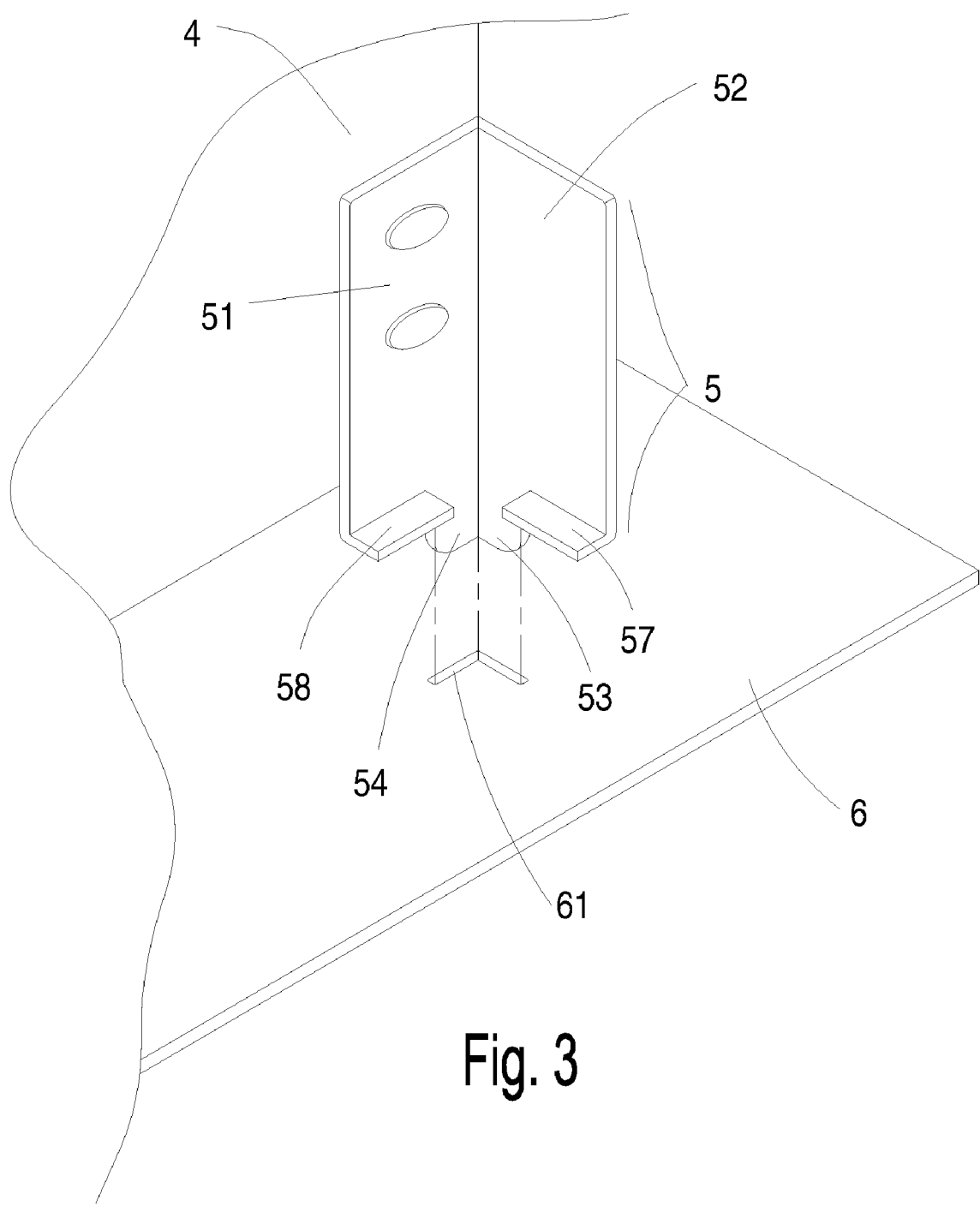
FIG. 3 is a schematic diagram showing the heat sink fixing device for fixing the heat sink on the printed circuit board according to a second preferred embodiment of the present invention.

In some embodiments, for better securing the heat sink 4 on the printed circuit board 6, the fixing device 5 of the heat sink 4 further comprises a plurality of extension ribs 57 and 58, as shown in FIG. 3, which is a schematic diagram showing the heat sink fixing device for fixing the heat sink on the printed circuit board according to a second preferred embodiment of the present invention. The extension ribs 57 and 58 are extended perpendicularly to the first pin 53 and the second pin 54 from the partial lower edges of the extension portion 52 and the connecting portion 51, respectively. When the heat sink 4 is to be fixed on the printed circuit board 6, the L-shaped pin structure formed by the first pin 53 and the second pin 54 is plugged into the corresponding pinhole 61 of the printed circuit board 6 for fixing the heat sink 4 on the printed circuit board 6. In the meantime, the extension ribs 57 and 58 lean against the printed circuit board 6 for assisting in positioning the heat sink 4 on the printed circuit board 6. Therefore, the heat sink 4 can be secured firmly on the printed circuit board 6 after the tin soldering process.

Figure 4:
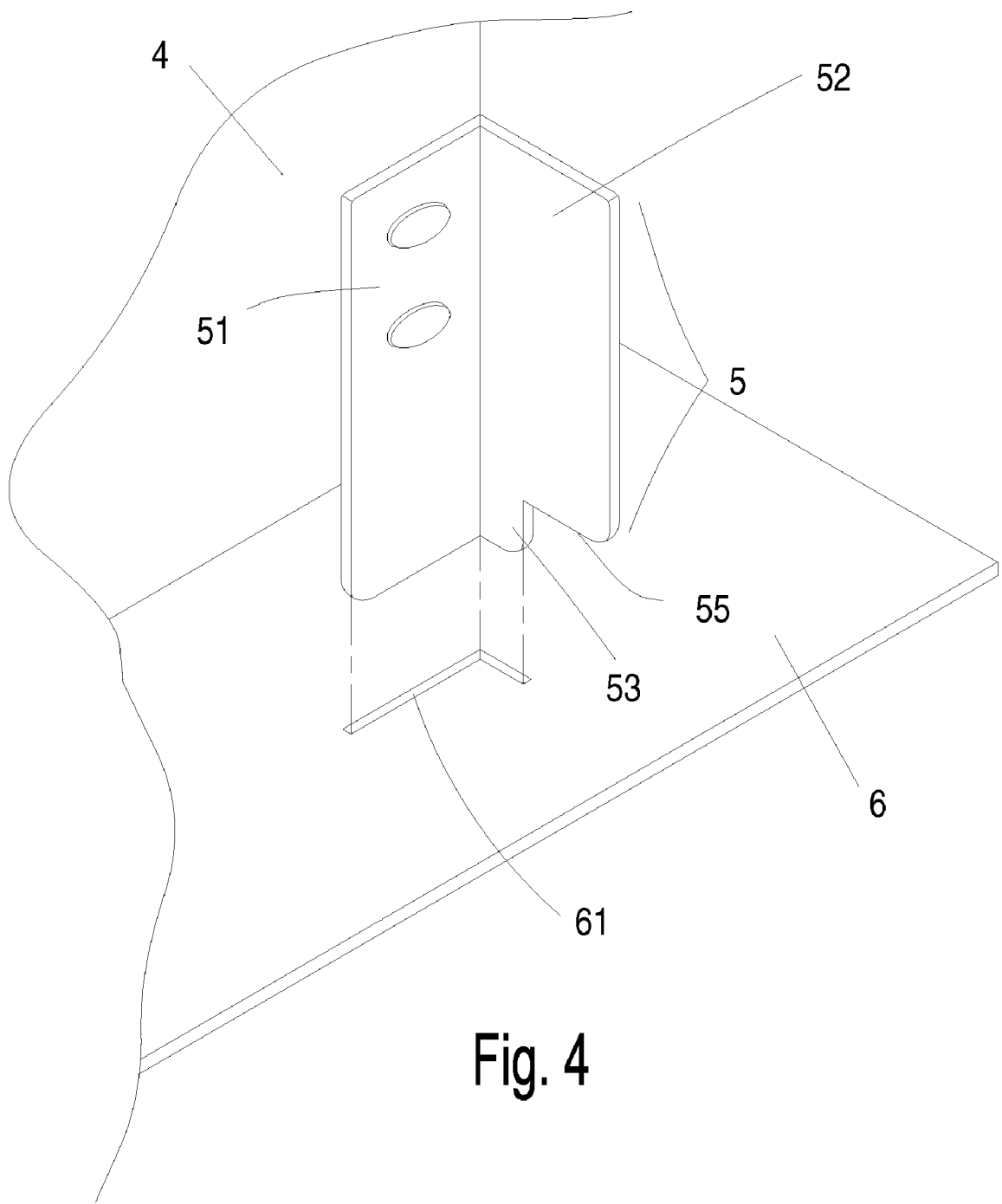
FIG. 4 is a schematic diagram showing the heat sink fixing device for fixing the heat sink on the printed circuit board according to a third preferred embodiment of the present invention.

Please refer to FIG. 4, which is a schematic diagram showing the heat sink fixing device for fixing the heat sink on the printed circuit board according to a third preferred embodiment of the present invention. As shown in FIG. 4, the fixing device 5 of the heat sink 4 comprises a connecting portion 51, an extension portion 52, and a first pin 53. The connecting portion 51 can be riveted to any side at the bottom of the heat sink 4 and connected with the extension portion 52. In this embodiment, an included angle between the extension portion 52 and the connecting portion 51 is substantially 90°, but not limited thereto. The first pin 53 is extended downward from the partial lower edge of the extension portion 52, and connected with the connecting portion 51. In this embodiment, the included angle between the first pin 53 and the connecting portion 51 is substantially 90°, but not limited thereto, to form an L-shaped pin structure. Besides, the width of the first pin 53 is smaller than that of the lower edge of the extension portion 52. In some embodiments, the connecting portion 51, the extension portion 52, and the first pin 53 are integrally formed.

Please refer to FIG. 4 again, when the heat sink 4 is to be fixed on the printed circuit board 6, the L-shaped pin structure formed by the first pin 53 and the lower part of the connecting portion 51 is plugged into the corresponding pinhole 61 of the printed circuit board 6 for fixing the heat sink 4 on the printed circuit board 6. In the meantime, the lower edge 55 of the extension portion 52 leans against the printed circuit board 6 for positioning the heat sink 4 on the printed circuit board 6. Then, the heat sink 4 is secured firmly on the printed circuit board 6 after the tin soldering process.

Figure 5:
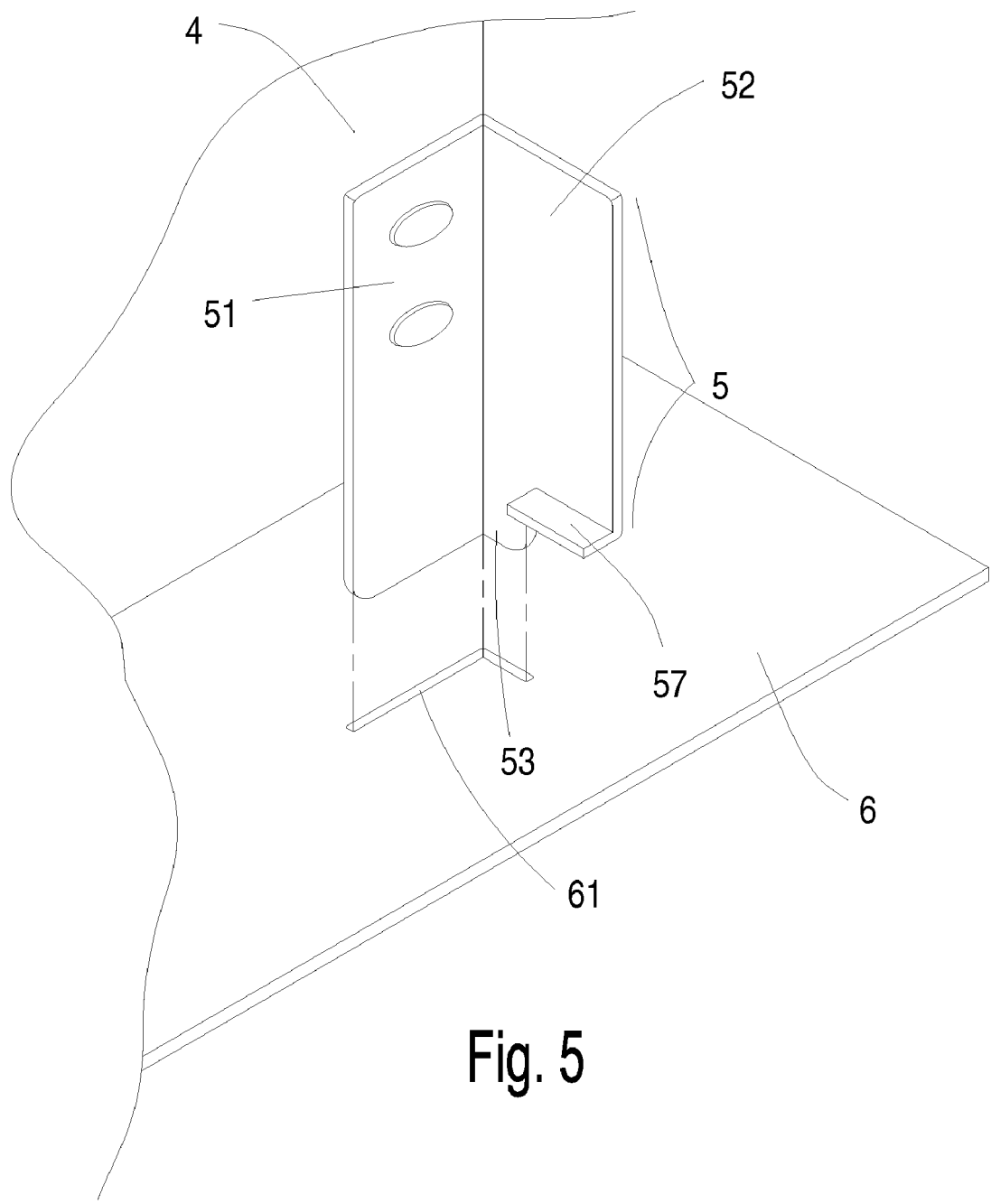
FIG. 5 is a schematic diagram showing the heat sink fixing device for fixing the heat sink on the printed circuit board according to a fourth preferred embodiment of the present invention

In some embodiments, for better securing the heat sink 4 on the printed circuit board 6, the fixing device 5 of the heat sink 4 further comprises an extension rib 57, as shown in FIG. 5, which is a schematic diagram showing the heat sink fixing device for fixing the heat sink on the printed circuit board according to a fourth preferred embodiment of the present invention. The extension rib 57 is extended perpendicularly to the first pin 53 from the partial lower edge of the extension portion 52. When the heat sink 4 is to be fixed on the printed circuit board 6, the L-shaped pin structure formed by the first pin 53 and the lower part of the connecting portion 51 is plugged into the corresponding pinhole 61 of the printed circuit board 6 for fixing the heat sink 4 on the printed circuit board 6. In the meantime, the extension rib 57 leans against the printed circuit board 6 for assisting in positioning the heat sink 4 on the printed circuit board 6. Therefore, the heat sink 4 can be secured firmly on the printed circuit board 6 after the tin soldering process.

Figure 6:
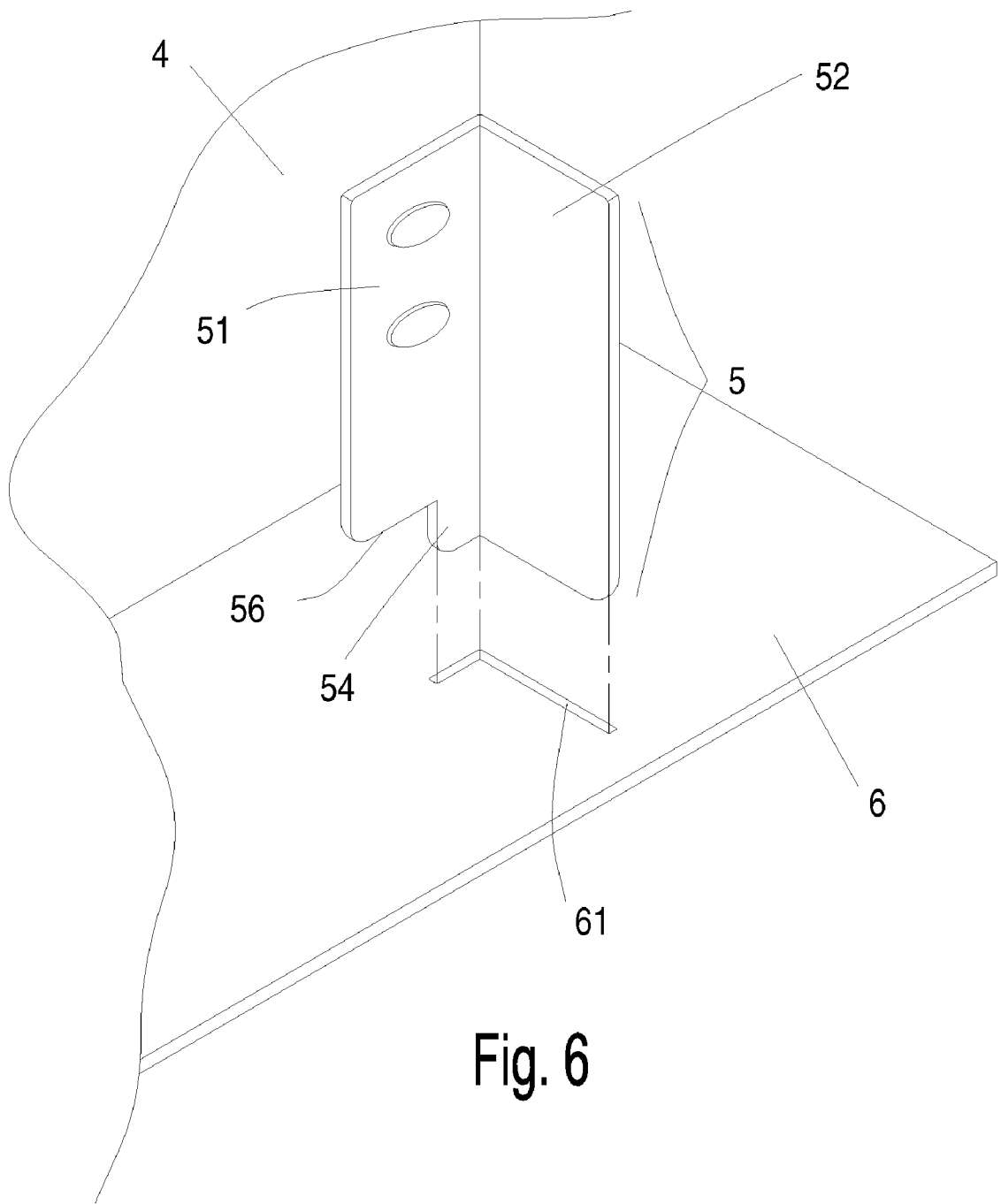
FIG. 6 is a schematic diagram showing the heat sink fixing device for fixing the heat sink on the printed circuit board according to the fifth preferred embodiment of the present invention.
Figure 7:
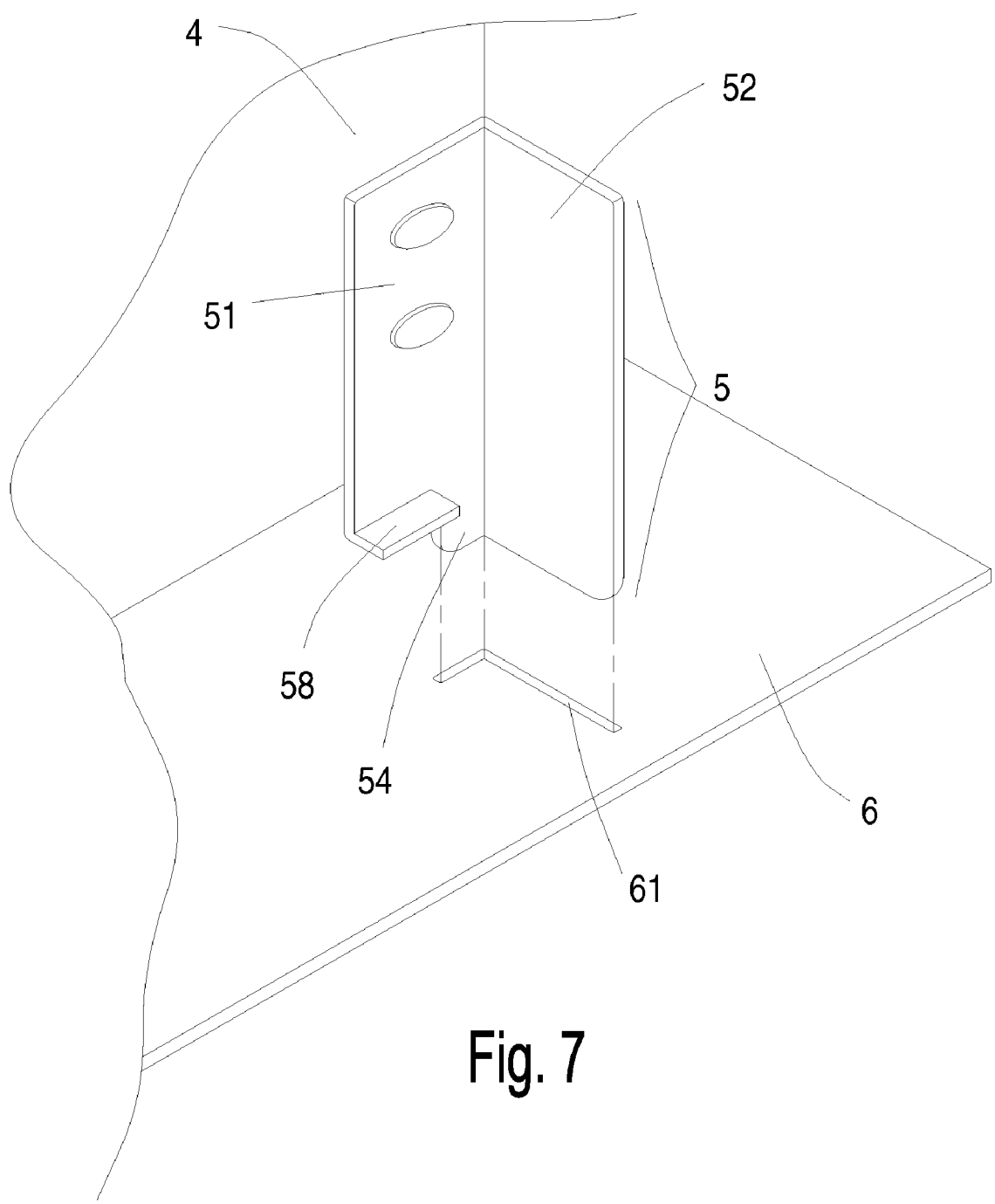
FIG. 7 is a schematic diagram showing the heat sink fixing device for fixing the heat sink on the printed circuit board according to the sixth preferred embodiment of the present invention.

Of course, as shown in FIGS. 6 and 7, the heat sink 4 can comprise a connecting portion 51, an extension portion 52, and a second pin 54 as a replacement of the first pin. The second pin 54 is extended downward from the partial lower edge of the connecting portion 51 and connected with the extension portion 52. The included angle between the second pin 54 and the extension portion 52 is substantially 90°, but not limited thereto, to form an L-shaped pin structure. The heat sink 4 can further comprise an extension rib 58 extended perpendicularly to the second pin 54 from the partial lower edge of the connecting portion 51. When the heat sink 4 is to be fixed on the printed circuit board 6, the L-shaped pin structure formed by the second pin 54 and the lower part of the extension portion 52 is plugged into the corresponding pinhole 61 of the printed circuit board 6 for fixing the heat sink 4 on the printed circuit board 6. In the meantime, the lower edge 56 of the connecting portion 51 or the extension rib 58 leans against the printed circuit board 6 for positioning the heat sink 4 on the printed circuit board 6. Therefore, the heat sink 4 is secured firmly on the printed circuit board 6 after the tin soldering process.

To sum up, the mechanical strength and the bearable bending stress of the pin structure in the heat sink fixing device of the present invention are stronger than those of the conventional structure, so the circuits of the printed circuit board would not be affected due to the collapse of the heat sink. Besides, the weight of the heat sink can be well carried by the pin structure, so the loading of the pins of the transistor on the heat sink can be reduced, so as to prevent the pins of the transistor and the copper foil on the printed circuit board from break or damage. Furthermore, since the L-shaped pin structure in the present invention has a larger tin soldering area, the break or damage of the solder ball can be avoided. Therefore, the heat sink can be secured on the printed circuit board firmly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat sink fixing device for fixing a heat sink on a printed circuit board, said fixing device comprising:
   a connecting portion to be fixed on one side of said heat sink;
   an extension portion connected with said connecting portion;
   a first pin extended downward from partial lower edge of said extension portion for plugging into said printed circuit board; and a second pin extended downward from partial lower edge of said connecting portion and directly connected to a lateral portion of said first pin for plugging into said printed circuit board.

2. The heat sink fixing device according to claim 1 wherein widths of said first pin and said second pin are smaller than those of lower edges of said extension portion and said connecting portion, respectively.

3. The heat sink fixing device according to claim 1 wherein said connecting portion, said extension portion, said first pin, and said second pin are integrally formed.

4. The heat sink fixing device according to claim 1 wherein an included angle between said extension portion and said connecting portion is substantially 90°, thereby said first pin and said second pin are connected together to form an L-shaped pin structure.

5. The heat sink fixing device according to claim 1 being made of a metal plate.

6. The heat sink fixing device according to claim 1 wherein said heat sink is made of aluminum or copper.

7. The heat sink fixing device according to claim 1 further comprising a plurality of extension ribs extended perpendicularly to said first pin and said second pin from partial lower edges of said extension portion and said connecting portion respectively for assisting in positioning said heat sink.

8. A heat sink fixing device for fixing a heat sink on a printed circuit board, said heat sink fixing device comprising:
a connecting portion to be fixed on one side of said heat sink;
an extension portion connected with said connecting portion; and
a first pin extended downward from partial lower edge of said extension portion and directly connected with said connecting portion by a lateral portion of said first pin for plugging into said printed circuit board with a lower part of said connecting portion.

9. The heat sink fixing device according to claim 8 wherein a width of said first pin is smaller than that of a lower edge of said extension portion.

10. The heat sink fixing device according to claim 8 wherein said connecting portion, said extension portion, and said first pin are integrally formed.

11. The heat sink fixing device according to claim 8 wherein an included angle between said extension portion and said connecting portion is substantially 90°, thereby said first pin and said connecting portion are connected together to form an L-shaped pin structure.

12. The heat sink fixing device according to claim 8 being made of a metal plate.

13. The heat sink fixing device according to claim 8 wherein said heat sink is made of aluminum or copper.

14. The heat sink fixing device according to claim 8 further comprising an extension rib extended perpendicularly to said first pin from partial lower edge of said extension portion for assisting in positioning said heat sink.

15. A heat sink structure comprising:
a heat sink; and
a fixing device disposed on one side at a bottom of said heat sink for fixing said heat sink on a printed circuit board, said fixing device comprising:
a connecting portion to be fixed on said side of said heat sink;
an extension portion connected with said connecting portion;
a first pin extended downward from partial lower edge of said extension portion for plugging into said printed circuit board; and
a second pin extended downward from partial lower edge of said connecting portion and directly connected to a lateral portion of said first pin for plugging into said printed circuit board.

16. The heat sink structure according to claim 15 wherein widths of said first pin and said second pin are smaller than those of lower edges of said extension portion and said connecting portion, respectively.

17. The heat sink structure according to claim 15 wherein said fixing device further comprises a plurality of extension ribs extended perpendicularly to said first pin and said second pin from partial lower edges of said extension portion and said connecting portion respectively for assisting in positioning said heat sink.

18. A heat sink structure comprising:
a heat sink; and
a fixing device disposed on one side at a bottom of said heat sink for fixing said heat sink on a printed circuit board, said fixing device comprising:
a connecting portion to be fixed on said side of said heat sink;
an extension portion connected with said connecting portion; and
a first pin extended downward from partial lower edge of said extension portion and directly connected with said connecting portion by a lateral portion of said first pin for plugging into said printed circuit board with a lower part of said connecting portion.

19. The heat sink structure according to claim 18 wherein said fixing device further comprises an extension rib extended perpendicularly to said first pin from partial lower edge of said extension portion for assisting in positioning said heat sink.

20. The heat sink fixing device according to claim 18 wherein said connecting portion, said extension portion, and said first pin are integrally formed.

* * * * *